(12) United States Patent
Kim et al.

(10) Patent No.: US 9,304,397 B2
(45) Date of Patent: Apr. 5, 2016

(54) METHOD FOR MANUFACTURING OF ORGANIC LIGHT EMITTING DISPLAY DEVICE

(71) Applicant: LG Display Co., Ltd., Seoul (KR)

(72) Inventors: Wy-Yong Kim, Seoul (KR); Byung Chul Ahn, Seoul (KR); Gee Sung Chae, Incheon (KR); Jin Wuk Kim, Gyeonggi-do (KR); Yoon Heung Tak, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 25 days.

(21) Appl. No.: 13/727,005

(22) Filed: Dec. 26, 2012

(65) Prior Publication Data
US 2014/0087312 A1 Mar. 27, 2014

(30) Foreign Application Priority Data

Sep. 27, 2012 (KR) ........................ 10-2012-0108349

(51) Int. Cl.
*G03C 5/16* (2006.01)
*G03F 7/20* (2006.01)
*G03F 7/00* (2006.01)

(52) U.S. Cl.
CPC ................ *G03F 7/20* (2013.01); *G03F 7/0035* (2013.01)

(58) Field of Classification Search
USPC .................................. 430/319, 329, 394, 944
See application file for complete search history.

(56) References Cited

U.S. PATENT DOCUMENTS

| 2007/0252525 A1 | 11/2007 | Seki |
| 2009/0184636 A1 | 7/2009 | Cok |
| 2010/0223779 A1 | 9/2010 | Lo et al. |
| 2011/0101317 A1 | 5/2011 | Gregory et al. |
| 2011/0201207 A1 | 8/2011 | Tsai et al. |
| 2012/0138936 A1* | 6/2012 | Lee et al. ........................ 257/59 |

FOREIGN PATENT DOCUMENTS

| JP | 57-178323 A | 11/1982 |
| JP | 2005-003979 A | 1/2005 |
| JP | 101800166 A | 8/2010 |

OTHER PUBLICATIONS

Chinese Office Action issued in Chinese Patent Application No. 201210597235.4 on Oct. 28, 2015.
Menard, et al., "Micro- and Nanopatterning Techniques for Organic Electronic and Optoelectronic Systems", Chem. Rev. 2007, 107, pp. 1117-1160.
Extended European Search Report, issued in European Patent Application No. 13168105.8 on Dec. 18, 2015.

* cited by examiner

*Primary Examiner* — Daborah Chacko Davis
(74) *Attorney, Agent, or Firm* — Morgan, Lewis & Bockius LLP

(57) ABSTRACT

Disclosed is a method of manufacturing an organic light emitting display device. The method include forming a driving thin film transistor and passivation layer on a substrate, forming a bank layer at a boundary portion between adjacent sub-pixels, on the passivation layer, laminating a first photoresist film on the bank layer, forming a first photoresist pattern by irradiating IR light on the first photoresist film in an area except a first sub-pixel, depositing a first organic emission layer in the first sub-pixel area exposed by the first photoresist pattern, removing the first photoresist pattern, laminating a second photoresist film on the bank layer, forming a second photoresist pattern by irradiating IR light on the second photoresist film in an area except a second sub-pixel, depositing a second organic emission layer in the second sub-pixel area exposed by the second photoresist pattern, and removing the second photoresist pattern.

18 Claims, 3 Drawing Sheets

METHOD FOR MANUFACTURING OF ORGANIC LIGHT EMITTING DISPLAY DEVICE

CROSS-REFERENCE TO RELATED APPLICATIONS

This application claims the benefit of the Korean Patent Application No. 10-2012-0108349 filed on Sep. 27, 2012, which is hereby incorporated by reference as if fully set forth herein.

BACKGROUND

1. Field of the Invention

The present invention relates to a method for manufacturing of an organic light emitting display device, and more particularly, to a method for manufacturing of an organic light emitting display device applicable to high resolution and a large area.

2. Discussion of the Related Art

As a type of new flat panel display device, organic light emitting display devices including organic light emitting diodes (OLEDs) are self-emitting display devices, and have a better viewing angle and contrast ratio than liquid crystal display (LCD) devices. Also, since the organic light emitting display devices do not need a separate backlight, it is possible to lighten and thin the organic light emitting display devices, and the organic light emitting display devices have excellent power consumption compared to LCD devices and the other flat panel display devices. Furthermore, the organic light emitting display devices are driven with a low direct current (DC) voltage, have a fast response time, and are low in manufacturing cost.

In the organic light emitting display devices, a fine metal mask (FMM) process, an inkjet process, a lift-off process, or the like is used for patterning an emission layer between two electrodes disposed on a substrate.

However, due to limitations of mask manufacturing technology, it is difficult to apply the FMM process to a large size and high resolution. That is, when the organic light emitting display device is applied to a large area, a mask sags due to the weight thereof, and thus, it is difficult to form a desired pattern. Also, the spread of organic materials increases due to a separated distance between the mask and a deposition portion, and therefore, it is difficult to realize high resolution. Furthermore, since the inkjet process needs to use a liquid material, the performance of an OLED exposed by a process is degraded. Especially, in the existing methods including an etching process, a disconnection occurs by direct contact between metal and etching solutions, or it is not easy to control an etching depth, causing the decrease in device characteristic.

Also, the lift-off process includes only an exposure operation and a development operation except an etching operation among operations included in a photo masking process, thereby enabling formation of a fine pattern. However, the defect of an emission layer is caused by a used solvent and a residual layer that is formed by strong adhesive strength in an operation of removing a photoresist pattern, and therefore, the lift-off process still degrades the efficient characteristic of a display device.

SUMMARY

Accordingly, the present invention is directed to a method of manufacturing an organic light emitting display device that substantially obviates one or more problems due to limitations and disadvantages of the related art.

An aspect of the present invention is directed to a method of manufacturing an organic light emitting display device that is applicable to high resolution and a large area, and can improve the emission efficiency of a display device.

Another aspect of the present invention is directed to a method of manufacturing an organic light emitting display device in which, a photoresist pattern formed on a bank layer prevents the contact of an organic emission layer, thus minimizing the damage of the organic emission layer and facilitating the formation of a pattern.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a method of manufacturing an organic light emitting display device which includes: forming a driving thin film transistor on a substrate; forming a passivation layer on the driving thin film transistor; forming an anode electrode in each of a plurality of sub-pixels, on the passivation layer; forming a bank layer at a boundary portion between adjacent sub-pixels, on the passivation layer; laminating a first photoresist film on the bank layer; forming a first photoresist pattern by irradiating infrared (IR) light on the first photoresist film in an area except a first sub-pixel; depositing a first organic emission layer in the first sub-pixel area exposed by the first photoresist pattern; removing the first photoresist pattern; laminating a second photoresist film on the bank layer; forming a second photoresist pattern by irradiating IR light on the second photoresist film in an area except a second sub-pixel; depositing a second organic emission layer in the second sub-pixel area exposed by the second photoresist pattern; and removing the second photoresist pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
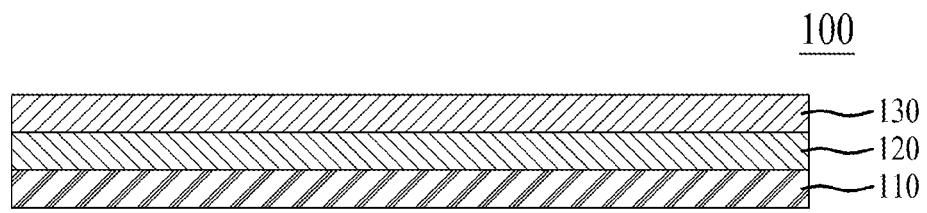
FIG. 1 is a sectional view illustrating a photoresist film according to an embodiment of the present invention.

Hereinafter, embodiments of the present invention will be described in detail with reference to the accompanying drawings. Like reference numerals refer to like elements throughout. In the following description, when the detailed description of the relevant known function or configuration is determined to unnecessarily obscure the important point of the present invention, the detailed description is not provided.

FIG. 1 is a sectional view illustrating a photoresist film according to an embodiment of the present invention.

Referring to FIG. 1, a photoresist film 100 according to an embodiment of the present invention includes a supporting film 110, a light expansion layer 120, and a photoresist composition material 130.

In an embodiment, in the photoresist film 100, the light expansion layer 120 may be formed on the supporting film 110, and the photoresist composition material 130 may be formed on the light expansion layer 120.

The supporting film 110 protects and supports the light expansion layer 120 and the photoresist composition material 130.

The supporting film 110 may be glass, a transparent film, or a polymer film that has excellent light transmittance. As an example of a suitable type of polymer film, the supporting film 110 may be a polyester (PS) film, and for example, the supporting film 110 may be a polyethylene terephthalate (PET) film or a polyethylene naphthalate (PEN) film. However, the spirit and scope of the present invention are not limited thereto, and the supporting film 10 may be formed of at least one of various materials.

Moreover, the light expansion layer 120 selectively absorbs only infrared (IR) light, converts the IR light into heat, and then is expanded with generated heat energy.

The light expansion layer 120 may include a material that has excellent properties for absorbing IR light and has a high ability for converting light energy to heat energy. For example, the light expansion layer 120 may include an organic compound such as carbon black, graphite pigment, or IR dye, metal such as Al, Sn, Ti or the like, oxide thereof, or a compound thereof.

The photoresist composition material 130 is photoresist (PR) that includes a ultraviolet (UV) hardening resin and an additive and thus has good elasticity.

The photoresist composition material 130 may include a UV hardening resin, and may be an organic compound having an acrylic group or a vinyl group. For example, a UV hardening resin may be poly methyl methacrylate (PMMA), butyl methacrylate (BMA), urethane acrylate, or poly vinyl alcohol.

In addition to the above-described configuration, the photoresist composition material 130 may include at least one of various additives. For example, the photoresist composition material 130 may include a photoinitiator or a photoacid generator as an additive, or include an additive such as a binder or a monomer including the same.

A photoinitiator hardens a binder in irradiating light, thereby increasing a hardening degree of the photoresist film 100. For example, the photoinitiator may include acetophenone, benzophenone, oxime or the like. The kind or content of the photoinitiator may be adjusted or determined depending on a desired pattern shape or a wavelength range of an exposure process.

A photoacid generator generates acid in irradiating light. For example, the photoacid generator may include triarylsulfonium salts, diaryliodonium salts, sulfonates, or a compound thereof.

A binder acts as a cross linking agent in irradiating light. For example, the binder may include novolak, polyester acrylate, epoxy acrylate, or urethane acrylate.

However, the spirit and scope of the present invention are not limited thereto, and the photoresist film 100 may be formed of at least one of various materials.

The photoresist composition material 130 is sprayed or coated on the light expansion layer 120 by one of an air knife, a roll coater, a spray, a dipping coater, a gravure coater, a spin coater, a bar coater, a doctor blade, and a slit coater, thereby forming the photoresist film 100. Alternatively, it may be designed that the photoresist composition material 130 is formed in a film shape and then adhered to the light expansion layer 120. The photoresist composition material 130 may have a thickness of 5 μm to 25 μm, and the spirit and scope of the present invention are not limited thereto.

Therefore, the photoresist film 100 according to an embodiment of the present invention is disposed on a bank layer 204, for forming a desired pattern. In this case, the photoresist film 100 is laminated such that a top of the bank layer 204 contacts the photoresist composition material 130.

Next, a method that forms a desired pattern by laminating the photoresist film 100 according to an embodiment of the present invention and manufactures an organic light emitting display device will now be described in detail.

FIGS. 2 to 8 are sectional views for describing a method of manufacturing an organic light emitting display device using the photoresist film according to an embodiment of the present invention.

Figure 2:
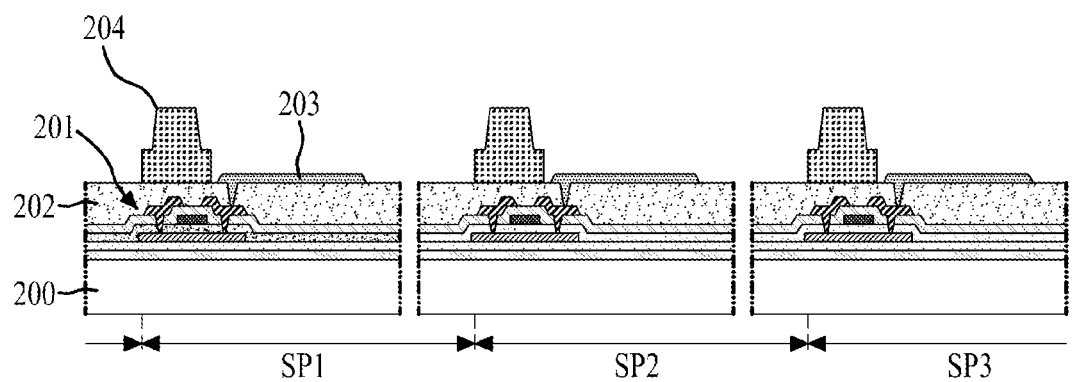
FIGS. 2 to 8 are sectional views for describing a method of manufacturing an organic light emitting display device using the photoresist film according to an embodiment of the present invention.

As illustrated in FIG. 2, a driving thin film transistor 201, a passivation layer 202, a first electrode 203, and the bank layer are formed on a substrate 200.

In an embodiment, an organic light emitting diode (OLED) includes the first electrode 203, a second electrode (not shown), and a plurality of organic emission layers 205, 206, and 207 formed therebetween. Therefore, a drain of the driving TFT 201 is electrically connected to the first electrode 203.

In this case, the first electrode 203 is an anode electrode, and is separately formed on the passivation layer 202 to contact the drain, in each of a plurality of sub-pixels. Here, the first electrode 203 may act as one of a plurality of electrodes included in an OLED, and may be formed of at least one of various conductive materials. Also, the first electrode 203 may be formed as a transparent electrode or a reflective electrode. When the first electrode 203 is used as the transparent electrode, the first electrode 203 may be formed of ITO, IZO, ZnO, or $In_2O_3$. When the first electrode 203 is used as the reflective electrode, a reflective film is formed of at least one of Ag, Mg, Al, Pt, Pd, Au, Ni, Nd, Ir, and Cr and a compound thereof, and then, the first electrode 203 may be formed of ITO, IZO, ZnO, or $In_2O_3$ on the reflective film.

Although not shown, the second electrode (not shown) is formed over the substrate 200, on the organic emission layers 205, 206 and 207. Here, the second electrode may be formed as a transparent electrode or a reflective electrode like the first electrode 203. When the second electrode is used as the transparent electrode, the OLED may include: a layer that is formed of Li, Ca, LiF/Ca, LiF/Al, Al, Mg, and a compound thereof; an assistant electrode or a bus electrode line that is formed of a transparent-electrode material, such as ITO, IZO, ZnO, or $In_2O_3$, on the layer. Also, when the second electrode is used as the reflective electrode, the second electrode may be formed by depositing Li, Ca, LiF/Ca, LiF/Al, Al, Mg, and a compound thereof over the substrate 200.

The organic emission layers 205, 206, and 207 are patterned and formed in correspondence with respective sub-pixel areas SP1 to SP3. Here, the organic emission layers 205, 206, and 207 may be formed as a single layer of a light emitting material, or formed as a multilayer including a hole injection layer, a hole transport layer, an emission layer (emitting material layer), an electron transport layer, and an electron injection layer for enhancing emission efficiency.

Here, the hole injection layer enables a hole to be smoothly injected into from the first electrode 203 to the emission layer, and may be formed of cupper phthalocyanine (CuPc), poly (3,4)-ethylenedioxythiophene (PEDOT), polyaniline (PANT), or N,N-dinaphthyl-N,N'-diphenyl benzidine (NPD). However, the spirit and scope of the present invention are not limited thereto.

The hole transport hole easily transports a hole to the emission layer, and moreover prevents an electron, generated from the cathode, from being moved to an emission area, thus increasing emission efficiency. That is, the hole transport layer enables the smooth transport of a hole, and may be formed of N,N-dinaphthyl-N,N'-diphenyl benzidine (NPD), N,N'-bis-(3-methylphenyl)-N,N'-bis-(phenyl)-benzidine (TPD), s-TAD, or 4,4',4"-Tris(N-3-methylphenyl-N-phenyl-amino)-triphenylamine (MTDATA). However, the spirit and scope of the present invention are not limited thereto.

The emission layer may include a host and a dopant. Also, the emission layer may be formed of a light emitting material for emitting red light, green light, blue light, or white light, or formed of a phosphor material or a fluorescent material. In a description on such light emitting materials, various materials will be described with reference to FIG. 6.

The electron transport layer enables the smooth transport of an electron, and may be formed of tris(8-hydroxyquinolino)aluminum (Alq3), PBD, TAZ, spiro-PBD, BAlq, or SAlq. However, the spirit and scope of the present invention are not limited thereto.

The electron injection layer enables the smooth injection of an electron, and may be formed of tris(8-hydroxyquinolino) aluminum (Alq3), PBD, TAZ, LiF, spiro-PBD, BAlq, or SAlq. However, the spirit and scope of the present invention are not limited thereto.

The bank layer 204 may be patterned in order for a partial region of the first electrode 203 to be exposed, and formed in each of the sub-pixel areas SP1 to SP3 on the first electrode 203. That is, by forming the bank layer 204, an opening may be formed on the first electrode 203, and the organic emission layers 205, 206, and 207 may be formed inside the opening.

Here, the bank layer 204 may be formed of an insulating material such as silicon oxide (SiOx) or silicon nitride (SiNx). In addition, the bank layer 204 may be formed of at least one of various insulating organic materials.

Therefore, in the organic light emitting display device, when a certain voltage is applied to the first electrode 203 and the second electrode (not shown) to according to a selected color signal, a hole and an electron are transported to the organic emission layers 205, 206, and 207 to generate an exciton, and, when the exciton is shifted from an excited state to a base state, visible light is emitted. At this point, the emitted light is transferred to the outside through the second transparent electrode (not shown), thereby realizing an arbitrary image.

Subsequently, an encapsulation operation is performed for protecting an OLED of each sub-pixel from the outside. In the present invention, a general thin film encapsulation process may be used. The thin film encapsulation process is known technology, and thus, its detailed description is not provided in the specification.

As described above, the method of manufacturing the organic light emitting display device (for example, OLED) has been described above as an example. However, in addition to a switching thin film transistor (not shown) and a driving thin film transistor that are formed in a unit pixel, a compensation circuit for compensating for a threshold voltage of the driving thin film transistor, namely, a plurality of driving elements may be additionally formed. The driving elements may be freely disposed in a pixel.

Figure 3:
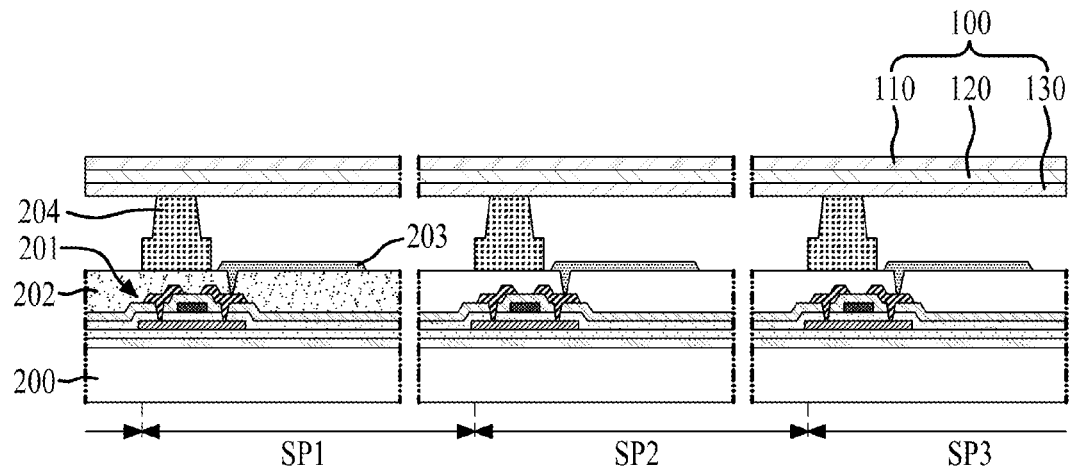

Subsequently, as illustrated in FIG. 3, the photoresist film 100 is laminated on the bank layer 204.

In an embodiment, the photoresist film 100 including the supporting film 110, the light expansion layer 120, and the photoresist composition material 130 is disposed to face an upper region of the bank layer 204 formed on the passivation layer 202, and then laminated uniformly. In this case, lamination is uniformly performed such that the photoresist film 100 does not sag in an opening formed due to the bank layer 204.

Although not shown, an assistant bank layer (not shown) may be further formed between adjacent bank layers 204 in order for the photoresist film 100 to be uniformly laminated.

Figure 4:
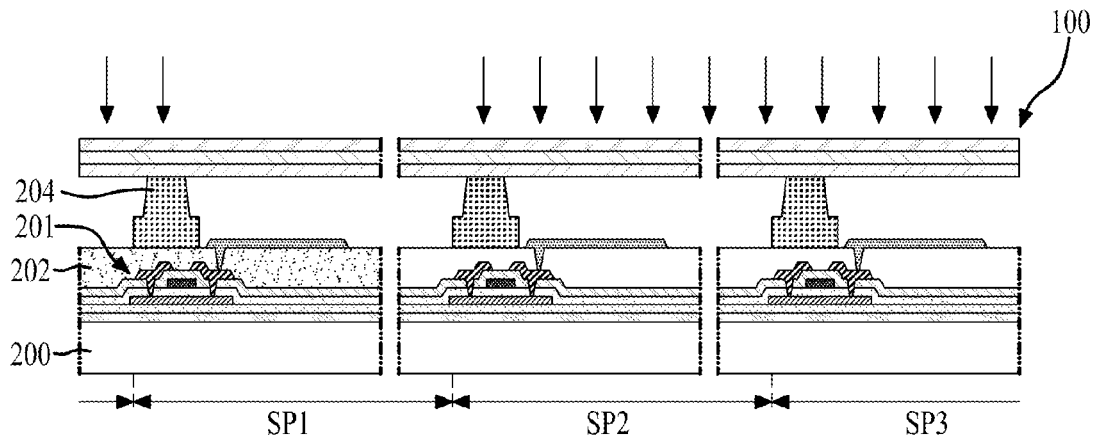
Figure 5:
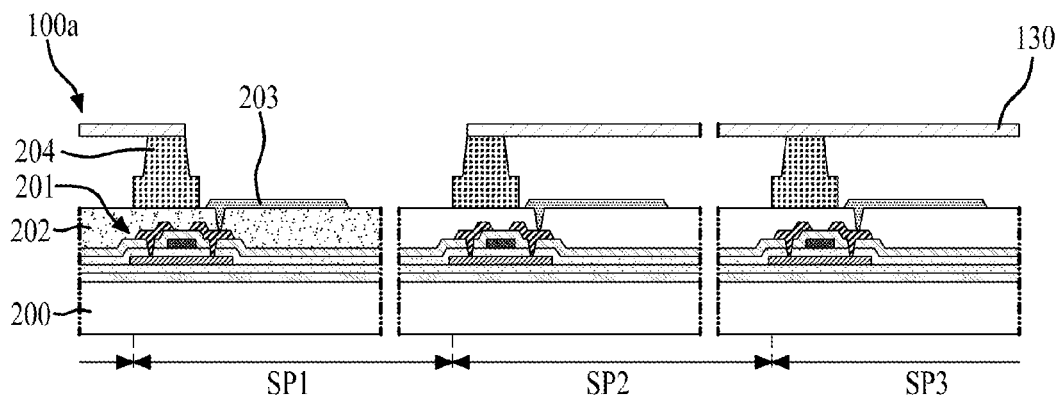

Subsequently, as illustrated in FIGS. 4 and 5, a photoresist pattern 100a is formed by irradiating IR light on the photoresist film 100.

In an embodiment, in irradiating a laser on a top of the photoresist film 100, an IR laser is irradiated on only an area except the first sub-pixel area SP1. Therefore, the photoresist pattern 100a has an opening for depositing an organic emission layer with a red light emitting material.

In this case, an IR laser having a wavelength of 1000 nm or more is irradiated on a scan region in the top of the photoresist film 100 by using a scan process or a separate mask. IR irradiation may be designed to have a constant energy density, wavelength, and irradiating time, but, for example, IR irradiation may be designed to have an energy density and a irradiating time at a wavelength band of 1000 nm or more.

Therefore, in the photoresist film 100, volume expansion due to heat is performed in only a region on which a laser has been irradiated, and layer detachment is performed. That is, volume expansion is performed in only the light expansion layer 120 on which a laser has been irradiated, and the light expansion layer 120 is detached from the photoresist composition material 130. Here, layer detachment between the light expansion layer 120 and the photoresist composition material 130 is not performed in a region (i.e., the first sub-pixel area SP1) on which a laser is not irradiated. Therefore, layer detachment is performed in only a region (i.e., a region on which a laser has been irradiated) except the first sub-pixel SP1, and, by removing the light expansion layer 120 in which layer detachment has occurred, the photoresist pattern 100a is left in only a region on which a laser has been irradiated.

Figure 8:
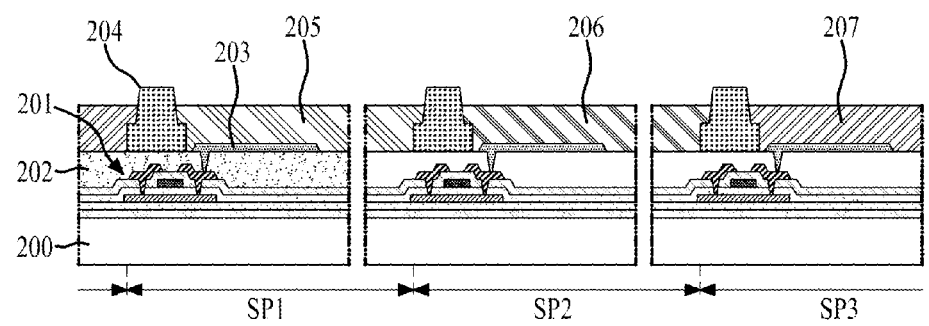

As a result, the photoresist pattern 100a in which an opening is formed in a first sub-pixel area (SP1 of FIG. 8) may be designed so as to enable the deposition of a red, blue, or green organic emission layer (205 of FIG. 8).

Although not shown, a photoresist pattern in which an opening is formed in a second sub-pixel area (SP2 of FIG. 8) or a third sub-pixel area (SP3 of FIG. 8) may be designed so as to enable the deposition of a red, blue, or green organic emission layer (206 or 207 of FIG. 8), but, a photoresist pattern in which an opening is formed in the third sub-pixel area SP3 may be designed so as to enable the deposition of the organic emission layer (207 of FIG. 8).

In this case, a photoresist pattern may be formed by irradiating an IR layer and separately adjusting a temperature, and an additional process such as temperature adjustment may be variously applied according to characteristic of a photoresist film.

Figure 6:
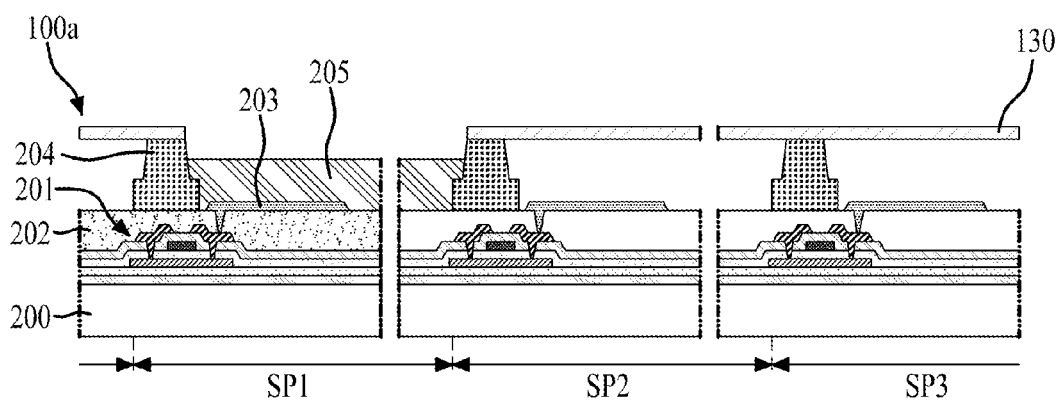

Subsequently, as illustrated in FIG. 6, the organic emission layer 205 is deposited on the first electrode 203 exposed by the photoresist pattern 100a.

In an embodiment, the organic emission layer 205 is deposited with a red light emitting material, on a top of the first electrode 203 exposed by the photoresist pattern 100a, namely, in the first sub-pixel area SP1.

Although not shown, in addition to the red light emitting material, the organic emission layer (206 of FIG. 8) may be deposited with a green light emitting material in the second sub-pixel area SP2, and the organic emission layer (207 of FIG. 8) may be deposited with a blue light emitting material in the third sub-pixel area SP3.

Here, a red light emitting material may include a host material including carbazole biphenyl (CBP) or 1,3-bis(carbazol-9-yl) (mCP), and include a phosphor material including a dopant including one or more selected from the group consisting of PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), and PtOEP (octaethylporphyrin platinum). On the other hand, the red light emitting material may include a phosphor material including PBD:Eu(DBM)3(Phen) or Perylene. However, the spirit and scope of the present invention are not limited thereto.

A green light emitting material may include a host material including CBP or mCP, and include a phosphor material including a dopant including Ir(ppy)3(fac tris(2-phenylpyridine)iridium). On the other hand, the red light emitting material may include a phosphor material including Alq3(tris(8-hydroxyquinolino)aluminum). However, the spirit and scope of the present invention are not limited thereto.

A blue light emitting material may include a host material including CBP or mCP, and include a phosphor material including a dopant including (4,6-F2 ppy)2Irpic or L2BD111. On the other hand, the red light emitting material include a phosphor material including a dopant including one or more selected from the group consisting of spiro-DPVBi, spiro-6P, DSB, DSA, PFO-based polymer, and PPV-based polymer. However, the spirit and scope of the present invention are not limited thereto.

For example, the organic emission layer (205 of FIG. 8) may be formed of a low molecular material such as Alq3 (host)/DCJTB (fluorescent dopant), Alq3 (host)/DCM (fluorescent dopant), or CBP (host)/PtOEP (phosphor organic metal complex) that is a red light emitting material, and a polymer material such as PFO-based polymer or PPV-based polymer. The organic emission layer (206 of FIG. 8) may be formed of a low molecular material such as Alq3, Alq3 (host)/C545t (dopant), or CBP (host)/IrPPY (phosphor organic material complex) that is a green light emitting material, and a polymer material such as PFO-based polymer or PPV-based polymer. The organic emission layer (207 of FIG. 8) may be formed of a low molecular material such as DPVBi, spiro-DPVBi, spiro-6P, DSB, or DSA that is a blue light emitting material, and a polymer material such as PFO-based polymer or PPV-based polymer.

Figure 7:
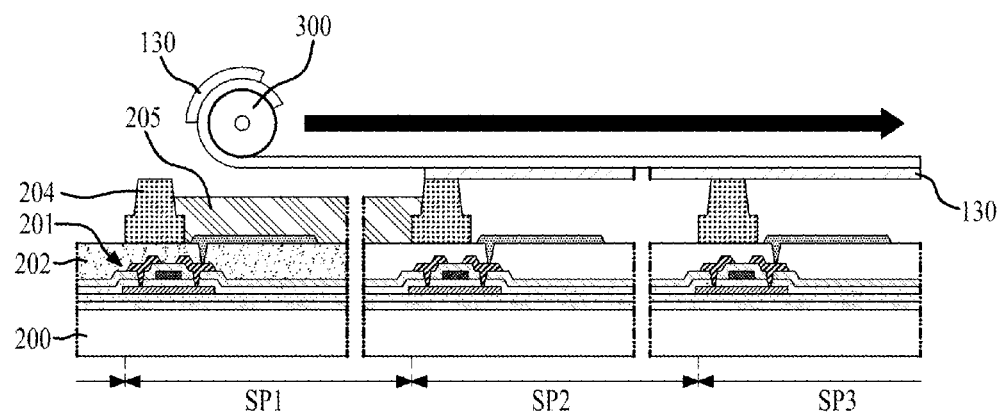

Finally, as illustrated in FIGS. 7 and 8, by removing the photoresist pattern 100a, the OLED in which the organic emission layers 205, 206, and 207 are formed on the first electrode 203 is manufactured.

In an embodiment, a separation roller 300 is disposed on the photoresist pattern 100a formed on the bank layer 204, and, by rotating the separation roller 300, the photoresist pattern 100a may be easily removed from the bank layer 204.

In this case, the separation roller 300 includes a detach film having adhesive strength similar to that of a generally used tape, but the spirit and scope of the present invention are not limited thereto. As another example, the photoresist pattern 100a may be easily removed from the bank layer 204 with separation instruments having various sizes or shapes.

According to the present invention, by repeatedly performing the manufacturing method of FIGS. 4 to 7, the organic emission layers 205, 206, and 207 are formed in the respective unit sub-pixels, and, by continuously depositing materials of the hole transport layer as well as the organic emission layer, the OLED may be manufactured.

Accordingly, in the organic light emitting display device, by introducing the photoresist film according to an embodiment of the present invention, the photoresist pattern formed on the bank layer prevents the contact of the organic emission layer, thus minimizing the damage of the organic emission layer and facilitating the formation of a desired pattern. As a result, the emission characteristic and service life of organic light emitting display device are improved, thus facilitating the manufacturing of the organic light emitting display device and enhancing productivity.

In the method of forming a pattern with the photoresist film according to an embodiment of the present invention, the organic light emitting display device including OLEDs has been exemplified in the specification, but the spirit and scope of the present invention are not limited thereto. As another example, the spirit and scope of the present invention may be applied to various display devices such as LCD devices, electrophoresis display (EPD) devices, etc.

According to the present invention, the organic light emitting display device can be applied to high resolution and a large area, and the emission characteristic and service life of organic light emitting display device are improved, thus facilitating the manufacturing of the organic light emitting display device and enhancing productivity.

That is, the photoresist pattern formed on the bank layer prevents the contact of the organic emission layer, thus minimizing the damage of the organic emission layer and facilitating the formation of a desired pattern.

Moreover, even when the photoresist pattern is formed only one time, red, green, and blue organic materials and the materials of the HTL and the like may be successively deposited by sub-pixel.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing an organic light emitting display device, comprising:
    forming a driving thin film transistor on a substrate;
    forming a passivation layer on the driving thin film transistor;
    forming an anode electrode in each of a plurality of sub-pixels, on the passivation layer;
    forming a bank layer on an entire surface of the substrate and then selectively patterning the bank layer into a plurality of bank patterns each formed at a boundary portion between adjacent sub-pixels, on the passivation layer, thereby exposing the anode electrode;
    laminating a first photoresist film on the plurality of bank patterns to cover the entire surface of the substrate;
    forming a first photoresist pattern by irradiating infrared (IR) light on the first photoresist film except for a first sub-pixel area, wherein a portion of the first photoresist film on the first sub-pixel area is detached to form a first opening to expose the first sub-pixel area;

depositing a first organic emission layer in the first sub-pixel area through the first opening;
removing the first photoresist pattern;
laminating a second photoresist film on the plurality of bank patterns to cover the entire surface of the substrate;
forming a second photoresist pattern by irradiating the IR light on the second photoresist film except for a second sub-pixel area, wherein a portion of the second photoresist film on the second sub-pixel area is detached to form a second opening to expose the second sub-pixel area;
depositing a second organic emission layer in the second sub-pixel area through the second opening; and
removing the second photoresist pattern.

2. The method of claim 1, wherein each of the first and second organic emission layer is one of red, green, and blue organic materials, and first and second organic emission layers are different organic materials.

3. The method of claim 1, wherein the IR light has a wavelength of 1000 nm or more.

4. The method of claim 1, wherein each of the first and second photoresist films comprises:
a photoresist composition material formed on the bank layer;
a light expansion layer selectively detached from the photoresist composition material by selectively absorbing the IR light; and
a supporting film supporting the light expansion layer and the photoresist composition material.

5. The method of claim 4, wherein,
the forming of the first photoresist pattern comprises:
detaching a portion of the photoresist composition material from the light expansion layer in only a region except the first sub-pixel area by selectively irradiating the IR light on the first photoresist film in an area except the first sub-pixel area; and
forming the first photoresist pattern formed of the photoresist composition material detached from the light expansion layer by removing the light expansion layer and the supporting film.

6. The method of claim 4, wherein,
wherein the forming of the second photoresist pattern comprises:
detaching a portion of the photoresist composition material from the light expansion layer in an area except the second sub-pixel area by selectively irradiating the IR light on the second photoresist film in the area except the second sub-pixel area; and
forming the second photoresist pattern formed of the photoresist composition material detached from the light expansion layer by removing the light expansion layer and the supporting film.

7. The method of claim 1, wherein,
the removing of the first photoresist pattern comprises rotating a separation roller on the first photoresist pattern to remove the first photoresist pattern, and
the removing of the second photoresist pattern comprises rotating the separation roller on the second photoresist pattern to remove the second photoresist pattern.

8. The method of claim 7, wherein the separation roller comprises a detach film.

9. The method of claim 1, further comprising:
preparing a third photoresist film;
laminating the third photoresist film on the plurality of bank patterns to cover the entire surface of the substrate;
forming a third photoresist pattern by irradiating infrared (IR) the IR light on the third photoresist film except for a third sub-pixel area, wherein a portion of the third photoresist film on the third sub-pixel area is detached to form a third opening to expose the third sub-pixel area;
depositing a third organic emission layer in the third sub-pixel area through the third opening; and
removing the third photoresist pattern.

10. The method of claim 9, wherein each of the first to third organic emission layer is one of red, green, and blue organic materials, and first to third organic emission layers are different organic materials.

11. The method of claim 9, wherein each of the first to third photoresist films comprises:
a photoresist composition material formed on the bank layer;
a light expansion layer selectively detached from the photoresist composition material by selectively absorbing the IR light; and
a supporting film supporting the light expansion layer and the photoresist composition material.

12. The method of claim 11, wherein the forming of the first photoresist pattern comprises:
detaching a portion of the photoresist composition material from the light expansion layer in an area except the first sub-pixel area by selectively irradiating the IR light on the first photoresist film in the area except the first sub-pixel area; and
forming the first photoresist pattern formed of the photoresist composition material detached from the light expansion layer by removing the light expansion layer and the supporting film.

13. The method of claim 11, wherein the forming of the second photoresist pattern comprises:
detaching a portion of the photoresist composition material from the light expansion layer in an area except the second sub-pixel area by selectively irradiating the IR light on the second photoresist film in the area except the second sub-pixel area; and
forming the second photoresist pattern formed of the photoresist composition material detached from the light expansion layer by removing the light expansion layer and the supporting film.

14. The method of claim 11, wherein the forming of the third photoresist pattern comprises:
detaching a portion of the photoresist composition material from the light expansion layer in an area except the first sub-pixel area by selectively irradiating the IR light on the third photoresist film in the area except the third sub-pixel area; and
forming the third photoresist pattern formed of the photoresist composition material detached from the light expansion layer by removing the light expansion layer and the supporting film.

15. The method of claim 9, wherein,
the removing of the first photoresist pattern comprises rotating a separation roller on the first photoresist pattern to remove the first photoresist pattern,
the removing of the second photoresist pattern comprises rotating the separation roller on the second photoresist pattern to remove the second photoresist pattern, and
the removing of the third photoresist pattern comprises rotating the separation roller on the third photoresist pattern to remove the third photoresist pattern.

16. The method of claim 15, wherein the separation roller comprises a detach film.

17. The method of claim 9, wherein the IR light is selectively irradiated on the area of the photoresist film by using a scan process or a separate mask.

18. The method of claim 1, wherein the IR light is selectively irradiated on the area of the photoresist film by using a scan process or a separate mask.

* * * * *